United States Patent
Blanchard et al.

(10) Patent No.: US 9,306,048 B2
(45) Date of Patent: Apr. 5, 2016

(54) DUAL DEPTH TRENCH-GATED MOS-CONTROLLED THYRISTOR WITH WELL-DEFINED TURN-ON CHARACTERISTICS

(71) Applicant: Pakal Technologies, LLC, San Francisco, CA (US)

(72) Inventors: Richard A Blanchard, Los Altos, CA (US); Hidenori Akiyama, Miyagi (JP); Woytek Tworzydlo, Austin, TX (US)

(73) Assignee: Pakal Technologies LLC, San Francisco, CA (US)

( * ) Notice: Subject to any disclaimer, the term of this patent is extended or adjusted under 35 U.S.C. 154(b) by 55 days.

(21) Appl. No.: 14/035,598

(22) Filed: Sep. 24, 2013

(65) Prior Publication Data

US 2014/0091855 A1    Apr. 3, 2014

Related U.S. Application Data

(60) Provisional application No. 61/708,048, filed on Oct. 1, 2012, provisional application No. 61/726,282, filed on Nov. 14, 2012, provisional application No. 61/836,031, filed on Jun. 17, 2013.

(51) Int. Cl.
| | |
|---|---|
| H01L 29/745 | (2006.01) |
| H03K 17/732 | (2006.01) |
| H01L 29/40 | (2006.01) |
| H01L 29/739 | (2006.01) |
| H01L 29/06 | (2006.01) |
| H01L 29/08 | (2006.01) |

(52) U.S. Cl.
CPC ........ *H01L 29/7455* (2013.01); *H01L 29/0619* (2013.01); *H01L 29/402* (2013.01); *H01L 29/7397* (2013.01); *H03K 17/732* (2013.01); *H01L 29/0834* (2013.01)

(58) Field of Classification Search
CPC . H01L 29/7397; H01L 29/744; H01L 29/745; H01L 29/7455; H01L 27/0817; H01L 27/1027; H01L 27/76877; H01L 29/42308; H01L 29/66363; H01L 29/74; H01L 29/42356; H01L 29/42336; H01L 29/4236; H01L 29/66734; H01L 29/7813; H01L 29/7825; H01L 2924/1302
USPC ................................. 257/138; 327/440; 1/138
See application file for complete search history.

(56) References Cited

U.S. PATENT DOCUMENTS

| | | | | |
|---|---|---|---|---|
| 5,457,329 | A | * | 10/1995 | Harada .......................... 257/153 |
| 5,525,821 | A | * | 6/1996 | Harada et al. ................. 257/331 |
| 5,554,862 | A | * | 9/1996 | Omura et al. .................. 257/137 |
| 6,091,107 | A | * | 7/2000 | Amaratunga et al. ......... 257/331 |
| 7,705,368 | B2 | | 4/2010 | Rodov et al. |

* cited by examiner

*Primary Examiner* — Jesse Y Miyoshi
*Assistant Examiner* — David Spalla
(74) *Attorney, Agent, or Firm* — Patent Law Group LLP; Brian D. Ogonowsky

(57) ABSTRACT

An insulated gate turn-off thyristor has a layered structure including a p+ layer (e.g., a substrate), an n− layer, a p-well, vertical insulated gate regions formed in the p-well, and n+ regions between the gate regions, so that vertical NPN and PNP transistors are formed. Some of the gate regions are first gate regions that only extend into the p-well, and other ones of the gate regions are second gate regions that extend through the p-well and into the n− layer to create a vertical conducting channel when biased. The second gate regions increase the beta of the PNP transistor. When the first gate regions are biased, the base of the NPN transistor is narrowed to increase its beta. When the product of the betas exceeds one, controlled latch-up of the thyristor is initiated. The distributed second gate regions lower the minimum gate voltage needed to turn on the thyristor.

20 Claims, 7 Drawing Sheets

DUAL DEPTH TRENCH-GATED MOS-CONTROLLED THYRISTOR WITH WELL-DEFINED TURN-ON CHARACTERISTICS

CROSS-REFERENCE TO RELATED APPLICATIONS

This application is based on provisional application Ser. No. 61/708,048, filed Oct. 1, 2012, by Richard Blanchard et al., and based on provisional application Ser. No. 61/726,282, filed Nov. 14, 2012, by Hidenori Akiyama et al., and based on provisional application Ser. No. 61/836,031, filed Jun. 17, 2013, by Woytek Tworzydlo et al., all provisional applications being assigned to the present assignee and incorporated herein by reference.

FIELD OF THE INVENTION

This invention relates to insulated gate turn-off thyristors (IGTOs) and, more particularly, to an IGTO that also incorporates insulated gate bipolar transistor (IGBT) cells for turning on the thyristor at a well-defined gate voltage.

BACKGROUND

FIG. 1 is a cross-sectional view of a portion of a prior art insulated gate turn-off thyristor 10 (IGTO) described in U.S. Pat. No. 7,705,368, incorporated herein by reference. An NPNP semiconductor layered structure is formed. In FIG. 1, there is a PNP transistor formed by a p+ substrate 12, an n− epitaxial (epi) layer 14, and a p-well 16. There is also an NPN transistor formed by the layer 14, the p-well 16, and an n+ layer 18. A bottom anode electrode 20 contacts the substrate 12, and a top cathode electrode 22 contacts the n+ layer 18. Trenches 24, coated with an oxide layer 25, contain a conductive gate material 26 (forming interconnected vertical gate regions) which is contacted by a gate electrode 28. The p-well 16 surrounds the gate structure, and the n− epi layer 14 extends to the surface around the p-well 16.

When the anode electrode 20 is forward biased with respect to the cathode electrode 22, but without a sufficiently positive gate bias, there is no current flow, since the product of the betas (gains) of the PNP and NPN transistors is less than one.

When there is a sufficient positive voltage applied to the gate, and there is a sufficient anode-cathode voltage, electrons from the n+ layer 18 become the majority carriers along the sidewalls and below the bottom of the trenches 24 in an inversion layer, causing the effective width of the NPN base (the portion of the p-well 16 below the trenches 24) to be reduced. As a result, the beta of the NPN transistor increases to cause the product of the betas to exceed one. This results in "breakover," when holes are injected into the lightly doped n− epi layer 14 and electrons are injected into the p-well 16 to fully turn on the thyristor. This is a controlled latch-up of the device. Accordingly, the gate bias initiates the turn-on, and the full turn-on is accomplished by the current flow through the NPN and PNP transistors.

When the gate bias is removed, the thyristor turns off.

Although not described in U.S. Pat. No. 7,705,368, the identical gate and cathode structure shown in FIG. 1 may be repeated as an array of cells across the thyristor, and the various components may be connected in parallel so each cell conducts a small portion of the total current. The array (or matrix) of cells includes cells designed to be inner cells and cells designed to be edge cells proximate to the edge of the p-well 16.

FIG. 2 is a cross-section of a portion of an edge cell 32 of a thyristor described in Applicant's U.S. patent publication US 2013/0115739, incorporated herein by reference, filed on Oct. 10, 2012 and published on May 9, 2013. The principle of operation of the cell 32 is the same as that of FIG. 1. The edge cell 32 includes a p-well 36, insulated gate regions 38, an oxide layer 39 within the trenches, an n+ layer 40 between the gate regions 38, a cathode electrode 42, a gate electrode 44, and dielectric regions 46 patterned to insulate the metal from certain areas. The cells are formed in an n− epi layer 50 grown over a silicon p+ substrate 52. An anode electrode 54 contacts the substrate 52.

The thyristor is formed of both inner cells and edge cells connected in parallel in a two-dimensional matrix.

As shown in FIG. 2, the edge cells, unlike the "inner" cells, are next to p+ guard rings 57 and 58 formed in the n− epi layer 50, which reduce electric field crowding near the edges of the die to improve the breakdown voltage of the thyristor.

Such IGTO thyristors have a relatively high current density when on. In contrast, insulated gate bipolar transistors (IGBTs) generally have a lower current density when on. Accordingly, for at least high current applications, IGTO thyristors are preferred.

A drawback of the IGTO thyristor of FIG. 1 or 2 is a fairly high gate turn-on voltage in conjunction with the difficulty of fabricating IGTO's with a consistent turn-on voltage. This lack of reproducibility is due to the difficulty is achieving precise gate trench depths, the difficulty in achieving precise doping levels, the difficulty is achieving the target gains of the NPN and PNP transistors, and other factors. Thus, the gate voltage for sufficiently modulating the NPN transistor base width to cause the product of the gains to exceed one (to initiate the thyristor action) is difficult to reproduce from one lot of IGTO thyristors to another.

What is needed is an improvement of the IGTO thyristor shown in FIG. 1 or 2 to lower the gate threshold voltage for turning on the thyristor and to make the turn-on voltage more consistent from one lot of thyristors to another.

SUMMARY

In one embodiment, a thyristor die comprises a two-dimensional array of cells, including inner cells and edge cells.

In one example, each cell comprises a p-well formed in an n− epi layer, where the p-well acts as a base for a vertical NPN transistor, and the n− epi acts as a base for a vertical PNP transistor in an NPNP structure. Vertical insulated gate regions are formed in the p-well. Between the gate regions is formed a top n+ layer serving as an emitter (cathode) for the NPN transistors. The substrate is a p+ type and serves as an emitter (anode) for the PNP transistor. In an off-state, the p-well serves as a wide base for the NPN transistor, and the product of the betas of the NPN and PNP transistors is less than one. Therefore, there is no thyristor action, and substantially no current conduction between the anode and cathode. When a positive gate voltage is applied above a threshold, the p-well base has a reduced thickness caused by an inversion layer (electrons), causing the beta of the NPN transistor to increase and causing the product of the betas to be greater than one. As a result, there is thyristor action, and current is conducted between the anode and cathode.

Due to process variations, there is variability in the gate depths, dopant profiles, and other factors which cause the required gate turn-on voltage and required forward biasing anode/cathode voltage (for turn on) to vary somewhat from product to product. Further, the gate turn-on voltage can be fairly high, such as 10 volts. It would be desirable to have a low, consistent gate turn-on voltage and a low minimum forward biasing voltage.

To achieve these goals, some of the vertical gate regions in the cells are formed to extend completely through the p-well (NPN transistor base) and into the n– epi layer. This vertical deep gate structure is fairly narrow so only takes up a small portion of each cell.

In the area of the deep gate region, the structure resembles a type of insulated gate bipolar transistor (IGBT) in that the gate (penetrating through the PN-junction) turns on a PNP bipolar transistor. However, because the full PNPN thyristor doping structure is retained in the deep gate region (i.e., the base is not shorted to the emitter next to the deep gate), the deep gate region is not truly equivalent to conventional IGBTs. This deep gate region can, in fact, operate as a thyristor when turned ON, similarly to standard (shallow gate) IGTO cells. However, the base-emitter can also be shorted as needed, in which case the deep gate regions closer resemble conventional IGBTs.

In the remainder of this document, the areas where the gates penetrate into the n– epi will be referred to as IGBTs for convenience (albeit not technically accurate), even when the base-emitter is not shorted, since there is some isolated gate bipolar transistor effect similar to an IGBT.

When the IGBT gate region has a sufficient positive voltage applied to it, the gate region creates an inversion layer, forming a channel, between the top n+ layer and the n– epi layer. The gate threshold voltage is well defined and relatively low, such as 2-5 volts.

Turning on the IGBT in that small area of a cell causes more carriers to be injected into the n– epi layer (acting as a base for the PNP transistor). The injected carriers spread horizontally and increase the beta of the PNP transistor by overcoming the recombination losses, which enables the thyristor to be turned on by the shallow gate regions at a lower voltage. By proper design, threshold deep gate voltage to turn on the IGBT is somewhat lower than the shallow gate voltage needed to turn on the IGTO thyristor. This results in the IGBT sufficiently increasing the beta of the PNP transistor to allow turn-on of the thyristor by the shallow gates at a gate voltage that is much lower than that required for FIGS. 1 and 2 and much more reproducible.

Therefore, both the IGBT portions and the thyristor portions of the device conduct current in parallel after being turned on by the low gate voltage. The thyristor conduction may support about twice the current density as the IGBT, making the device very efficient. Since the IGBT takes up a relatively small portion of the device, it does not significantly reduce the efficiency of the thyristor, and, in fact, the IGBT action may be considered negligible once the thyristor is turned on.

Accordingly, there is an unexpected synergy in using a small portion of the device as an IGBT.

Since the cells share the same p-well, the deep gate regions may be distributed throughout the cell array and do not need to be in every cell.

Accordingly, the hybrid IGTO/IGBT structure operates somewhere between a pure IGBT structure and a pure IGTO structure. There is a trade-off between various performance differences between the IGTO thyristor, IGBT, and hybrid IGTO thyristor/IGBT, including gate turn on voltage, minimum anode-cathode voltage for turn-on, current density, voltage drop (the voltage drop of the thyristor is lower than an IGBT), etc., and the designer or user selects the gate configuration to achieve optimal performance for a particular application.

Optionally, in the area of the deep gate region, the n+ layer and the p-well may be shorted to achieve a more consistent turn-on voltage.

Optionally, the IGBT deep gate regions are not shorted to the shallower gate regions so as to be independently controlled to achieve a desired device performance (e.g., controlled turn-off and turn-on characteristics, etc.).

In another embodiment, all the gate region depths are the same, but the p-well in the IGBT area is narrowed to cause the gate region to extend into the n– epi layer.

Other embodiments are described.

BRIEF DESCRIPTION OF THE DRAWINGS

Elements that are similar or identical in the various figures are labeled with the same numeral.

DETAILED DESCRIPTION

Figure 2:
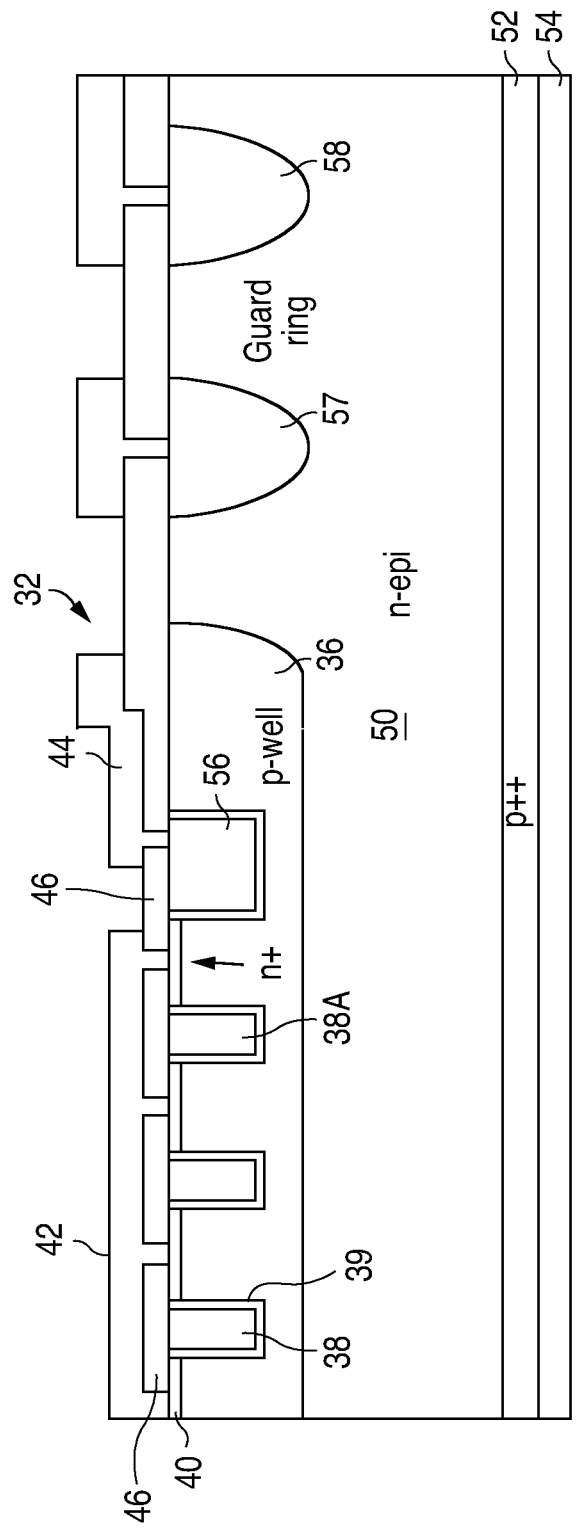
FIG. 2 is a cross-sectional view of an edge cell in Applicant's previous thyristor design, which the present invention improves.
Figure 3A:
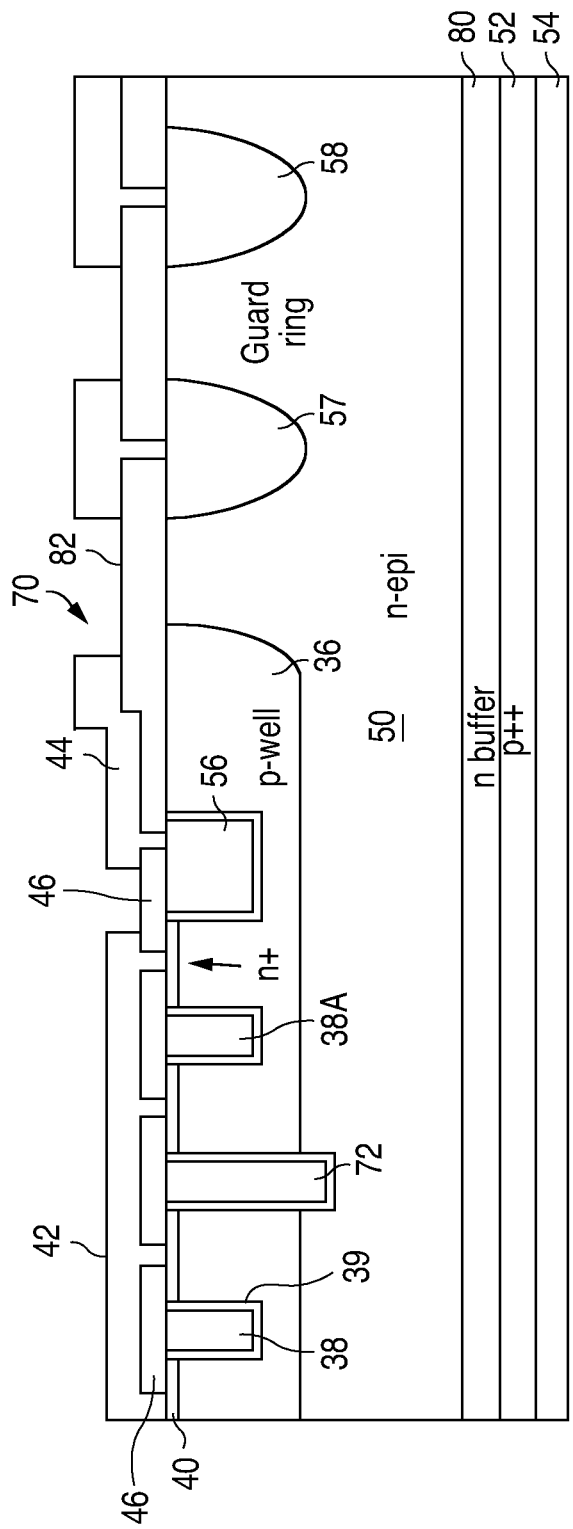
FIG. 3A illustrates adding a deep gate region to the edge cell of FIG. 2, along with adding the deep gate region to inner cells, in accordance with one embodiment of the invention.

FIG. 3A is a cross-sectional view of a small portion of an IGTO thyristor that includes an edge cell 70 in accordance with one embodiment of the invention. The edge cells around the perimeter of the thyristor (between the inner cells and the edge of the die) may be identical. The inner cells are identical to one another and may be identical to the edge cells, except that the p-well 36 is continuous in the inner cells. Elements that may be the same in FIGS. 2 and 3A are similarly labeled and need not be described again.

As seen in FIG. 3A, the gate region 72 is extended down into the n– epi layer 50 to form a structure similar to an insulated gate bipolar transistor (IGBT) at that portion of the cell 70. Since the base-emitter is not shorted in that area, allowing latch-up when the thyristor is conducting, the IGBT differs significantly from conventional IGBTs.

Figure 1:
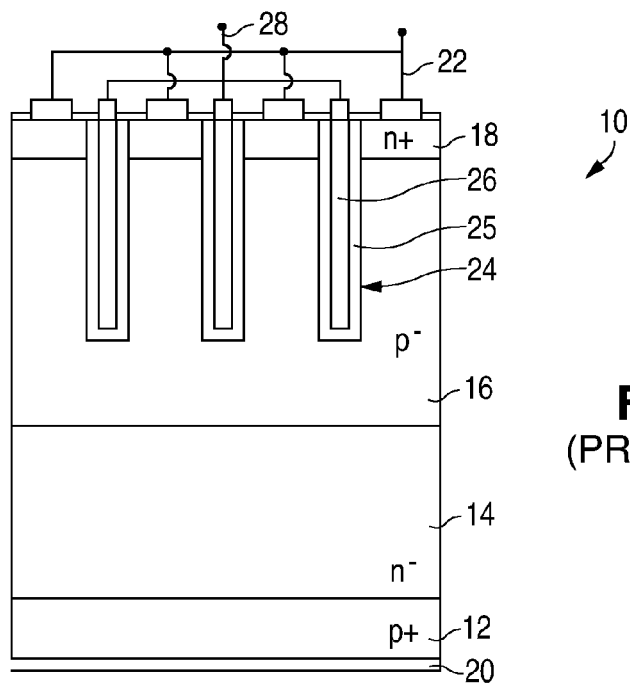
FIG. 1 is a cross-sectional view of a prior art insulated gate turn-off (IGTO) thyristor.
Figure 4:
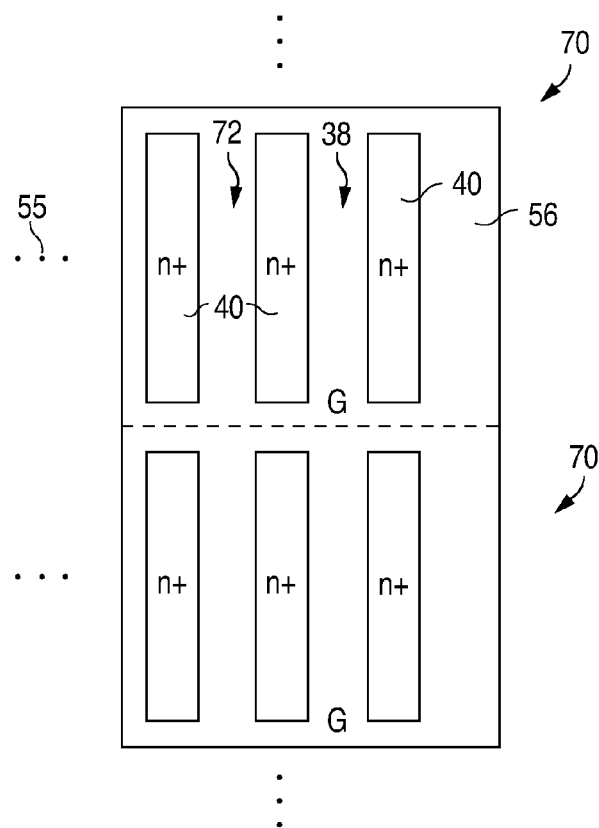
FIG. 4 is a compressed top down view of two edge cells in the thyristor, which are similar to the inner cells, where one or more of the gate regions are deep gate regions.

FIG. 4 is a compressed top down view of two edge cells 70 in the thyristor, showing only two gate regions 72 and 38 per cell, where gate region 72 is the deep gate region. The edge cells form a perimeter around the inner cells and may be substantially identical to the inner cells. The gate region of one inner cell continues across the cell boundary to the next inner cell or to an edge cell, so that, effectively, there is only one large gate in the thyristor. The continuation of the matrix in two-dimensions is represented by the ellipses 55. In one embodiment, there are between four to nine parallel gate regions per cell. The rightmost gate region 56 in FIG. 3A serves as an electrical connector between the gate electrode 44 and the other gate regions 38/72 in the thyristor (assuming the deep gate regions and the shallow gate regions are interconnected). The gate region 56 is not surrounded by the n+ layer 40.

Turning on the IGBT in that small area of a cell, by applying 2-5 volts to the deep gate region 72 relative to the cathode, causes more carriers to be injected into the n– epi layer 50 (acting as a base for the PNP transistor). The IGBT basically shorts the n+ layer 40 in the vicinity of the deep gate region 72 to the n– epi layer 50. Since the injected carriers spread horizontally, this effectively increases the beta of the PNP transistor in the IGTO thyristor areas, since the injected carriers overcome the inherent recombination loss mechanism in the PNP transistor. Since the IGTO thyristor action begins when the products of the NPN and PNP transistor betas exceeds one, and the IGBT increases the beta of the PNP transistor, the shallow gate region 38 voltage needed to sufficiently increase the NPN transistor beta (by modulating the NPN transistor base width) to initiate the thyristor action is lowered. By proper design, the threshold deep gate region 72 bias to turn on the IGBT is somewhat lower than the shallow gate region 38 bias needed to initiate turn on of the IGTO thyristor (since the IGBT action first needs to sufficiently increase the beta of the PNP transistor in order for the shallow gate regions to then initiate thyristor action at the lowered gate voltage). When the product of the betas exceeds one, and the anode-cathode voltage is sufficiently high, the thyristor action will start, resulting in a controlled latch-up, causing the remaining portion of the cell to conduct current. Therefore, both the IGBT portions and the thyristor portions of the device conduct current in parallel. The thyristor conduction may incur about twice the current density as the IGBT, for high efficiency operation. Since the IGBT takes up a relatively small portion of each cell, it does not significantly reduce the efficiency of the thyristor, and its effect, after the thyristor turns on, may be negligible.

Accordingly, there is an unexpected synergy in using a small portion of the device as an IGBT.

Since the cells share the same p-well, the deep gate regions may be distributed throughout the cells array and do not need to be in every cell.

In one embodiment, about one-tenth of the total gate region is a deep gate region. This may be as few as one deep gate region per cell or less. The percentage of deep gate regions may be varied to achieve a desired device performance, including making all the gate regions deep gate regions to create a device similar to an IGBT. However, the highest current density will typically be achieved with a large portion of the device being an IGTO thrysistor.

When fewer deep gate regions are used, there is a higher minimum anode turn on voltage required (relative to the cathode) to initiate the thyristor action, assuming all the gates are sufficiently positively biased. Once the thyristor conducts a sufficient current, the anode voltage rapidly decreases to a low level (the device's voltage drop), since the thyristor is in a controlled latch-up mode of operation. If all the gate regions were deep gate regions, the structure would more resemble an IGBT, and there would be a substantially monotonic relationship between the anode voltage and the anode current at low voltages/currents when all the gate regions are positively biased. If all the gate regions were deep gate regions and the anode voltage was above a certain level, the anode current would be determined by the gate voltage.

When turned on, an IGBT typically has a voltage drop that is higher than the voltage drop of a thyristor, and the current density is less than that of an IGTO thyristor, so a pure IGBT is not as desirable for large current applications.

Accordingly, the hybrid IGTO thyristor/IGBT structure operates somewhere between a pure IGBT structure and a pure IGTO thyristor structure. There is a trade-off between various performance differences between the IGTO thyristor, IGBT, and hybrid IGTO thyristor/IGBT, including gate turn on voltage, minimum anode-cathode voltage for turn-on, current density, voltage drop, etc., and the designer or user selects the gate configuration to achieve optimal performance for a particular application.

Figure 3B:
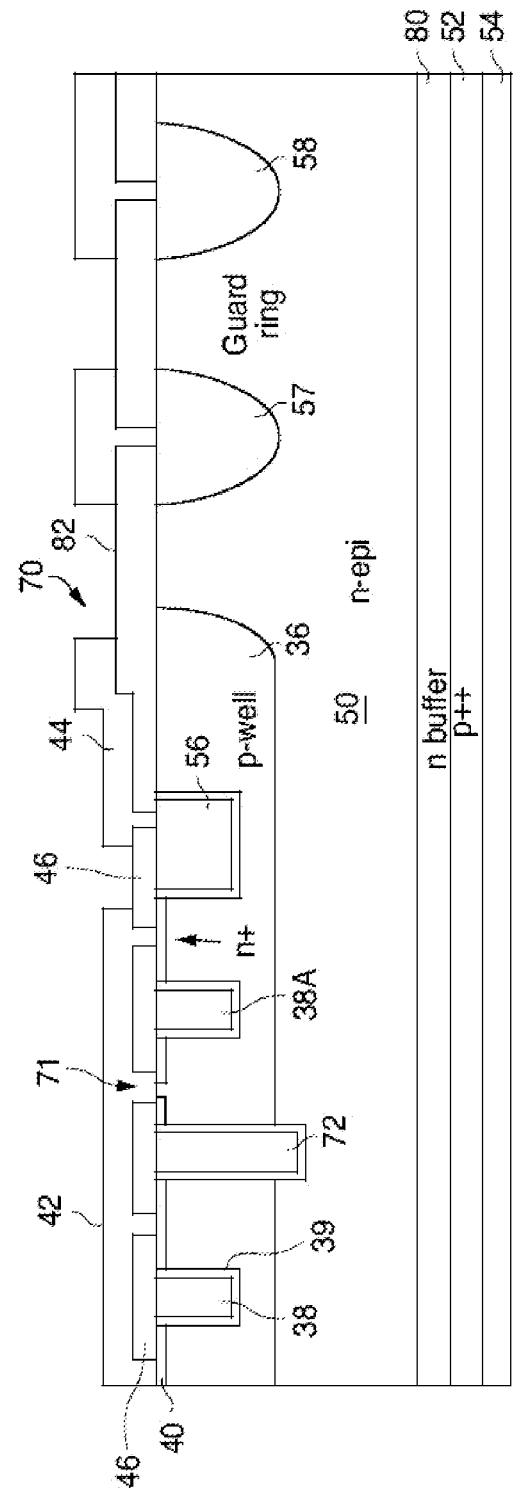
FIG. 3B is similar to FIG. 3A except the p-well and the n– epi are shorted next to a deep gate region.

Optionally, in the area of the deep gate region 72, the n+ layer 40 and the p-well 36 may be shorted to achieve a more consistent turn-on voltage, as shown in FIG. 3B at area 71. This configuration may be obtained by blocking implantation of the n-type dopants around the deep gate region 72 on one or both sides of the deep gate region 72, using an implant mask, when forming the n+ layer 40. When the metal cathode electrode 42 is deposited, it will short the p-well 36 to the n+ layer 40 in the area of the deep gate region 72 to lower the IGBT turn-on voltage and prevent latch-up in the IGBT area.

Figure 5:
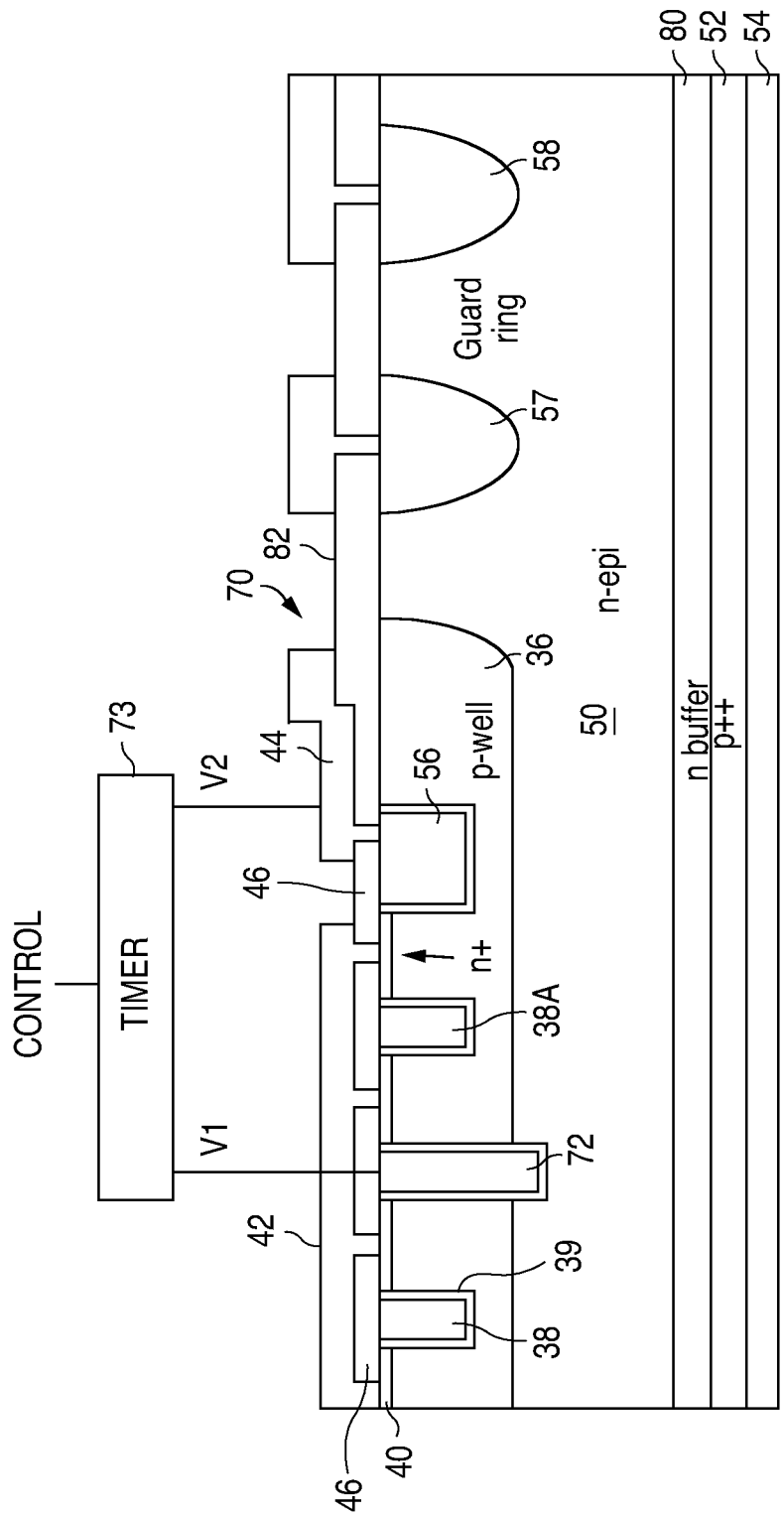
FIG. 5 illustrates an embodiment where the deep gate regions are not shorted to the shallow gate regions.

Optionally, the IGBT deep gate regions are not shorted to the shallower gate regions so as to be independently controlled to achieve a desired device performance. This operation is shown in FIG. 5. For example, the IGBT gate region 72 can be left positively biased (e.g., 2-5 volts) for about 50 microseconds after the shallow gate regions 38 have been shorted to the cathode (to turn off the thyristor) to achieve a particular turn-off characteristic. In FIG. 5, a turn-on/off control signal is applied to a timer circuit 73. For turn-on, the gate control signals V1 and V2 may occur at the same time, or one gate region may be turned on before the other to achieve a particular turn-on characteristic.

Additionally, by allowing for different voltages to be applied to the deep gates and the shallow gates, the gate voltages may be optimized for the IGBT action and the thyristor action. For example, the optimal operation of the IGBT may require a gate voltage of 2 volts, while the optimal operation of the thyristor may require a gate voltage of 4 volts. Such optimal voltages depend on the physical characteristics of the device and/or the particular application of the device. In one embodiment, the IGBT and thyristor are controlled separately (by separate control of the gate voltages) to achieve a two-step current profile, or a ramping current profile, for limiting surges.

Figure 6:
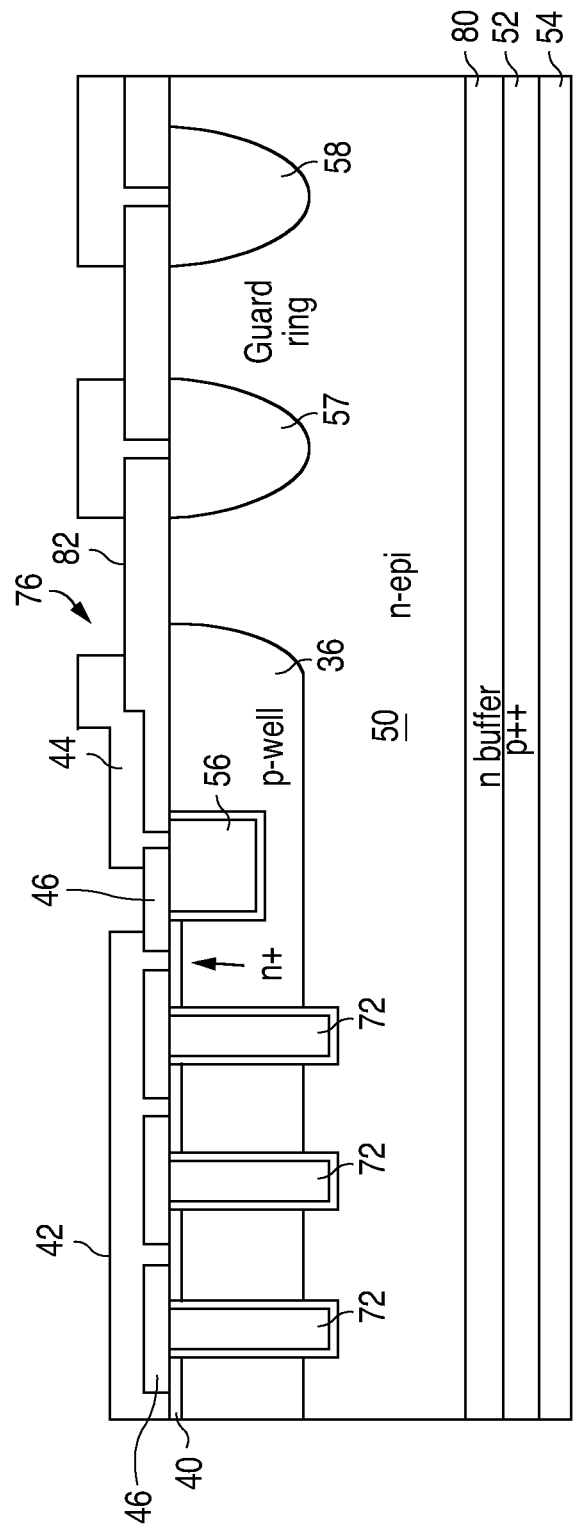
FIG. 6 illustrates employing deep gates as all the gates in the edge cell of FIG. 3, including employing deep gates as all the gates in the inner cells.

FIG. 6 illustrates an embodiment where all the gates in the cells 76 are deep gate regions 72 to cause the device to more resemble an IGBT. As mentioned above, there are trade-offs between the hybrid device and an IGBT.

Figure 7:
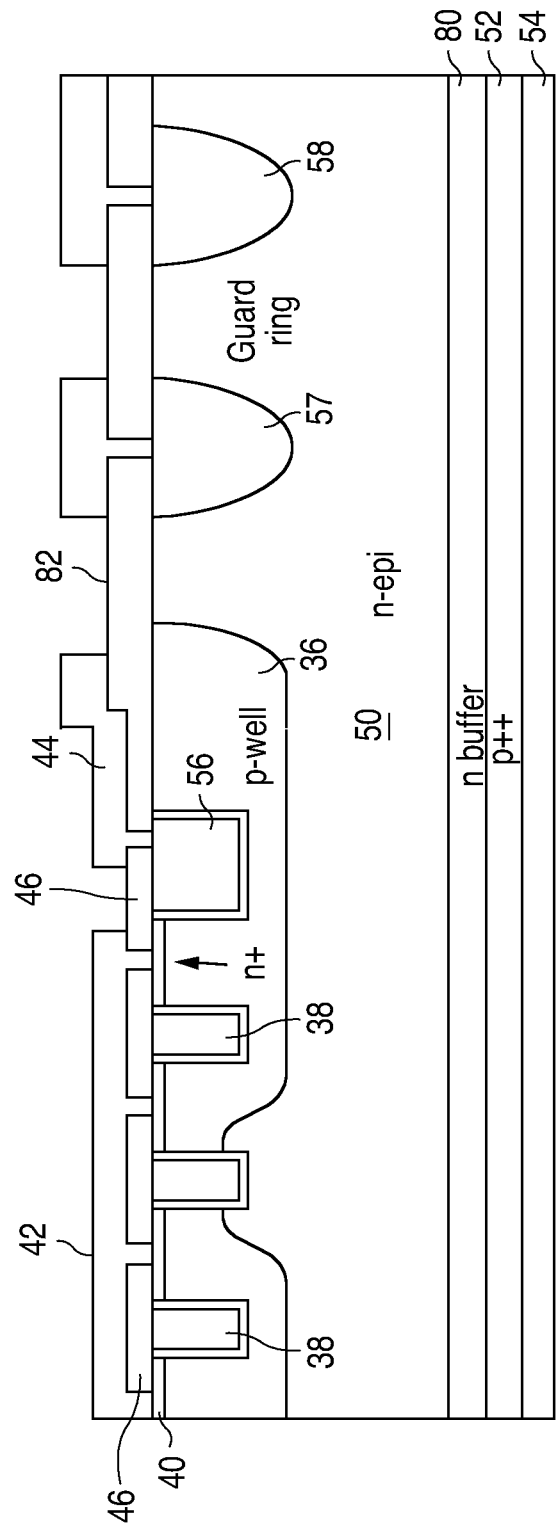
FIG. 7 illustrates an embodiment, the where the gate regions have the same depth, but the p-well depth is varied to cause one or more of the gate regions to extend into the n– epi layer.

FIG. 7 is a variation of the embodiment of FIG. 3 where the p-well 36 smoothly rises in the vicinity of one or more of the gate regions to cause the gate region to extend into the n– epi layer 50. This has the same effect as a deep gate region but does not require the deep etching of the gate trench. The double curve of the p-well 36 is able to withstand a high reverse voltage. Sharp edges of regions are avoided in high voltage devices to minimize electric field concentrations. Edges should have a relatively large radius of curvature. The shape of the p-well 36 in FIG. 7 allows for a high radius of curvature for withstanding a high voltage.

In contrast to FIG. 7, it is known to form two opposing wells with rounded edges and a space between the wells, then form a vertical gate intersecting the two wells, such as shown in FIG. 8 of U.S. Pat. No. 6,091,107. However, the gate has to be wide to enable the two wells to be separate and to have a sufficiently high radius of curvature to avoid breakdown. In FIG. 7, a single well is used with a large radius of curvature and enables a very narrow gate to extend into the n− epi layer 50. Since the gate can be very narrow, it does not take up much current carrying area. Further, the positioning of the gate relative to the p-well 36 does not have to be precise, as long at the gate intersects the narrow section of the p-well 36. Accordingly, the technique of FIG. 7 is an improvement over the technique described in the U.S. Pat. No. 6,091,107.

Typically, the cathode electrode 42 is connected to ground, and a load (e.g., a motor) is connected between the anode electrode 54 and a positive voltage supply terminal. Alternatively, the anode electrode 54 is connected to a positive voltage supply terminal, and the load is connected between the cathode electrode 42 and ground.

In one embodiment, the n+ layer 40 is formed by an implant of arsenic or phosphorus at an energy of 10-150 keV and an area dose of $5 \times 10^{13}$ to $10^{16}$ cm$^{-2}$, to create a dopant concentration exceeding $10^{19}$ cm$^{-3}$. In one embodiment, the n+ layer 40 has a depth of 0.05-1.0 microns.

To reduce the injection of holes into the n− epi layer 50 from the p+ substrate 52 when the thyristor is off, an n-type buffer layer 80 is grown with a dopant concentration higher than that of the n− epi layer 50.

Further details of the fabrication of the thyristor are presented below.

The starting p+ substrate 52 may have a dopant concentration of $1 \times 10^{18}$ to $2 \times 10^{19}$ cm$^{-3}$.

The n-type buffer layer 80 is then grown to a thickness of 3-10 microns thick and has a dopant concentration between about $10^{17}$ to $5 \times 10^{17}$ cm$^{-3}$.

The n− epi layer 50 is grown to a thickness of 40-70 microns (for a 600V device) and has a doping concentration between about $5 \times 10^{13}$ to $5 \times 10^{14}$ cm$^{-3}$. This dopant concentration can be obtained by in-situ doping during epi growth.

Field oxide 82 is then grown to a thickness of, for example, 0.6-2 microns. LOCOS technology may be used. The active areas are defined using a mask if LOCOS technology is not used. Otherwise, the active areas are defined by the LOCOS oxide mask.

The p-well 36 is then formed by masking and boron dopant implantation. Preferably, some of the doping of the p guard rings 57 and 58 is performed in the same patterned implant. The peak doping in the p-well 36 can be, for example, $10^{16}$-$10^{18}$ cm$^{-3}$. The depth of the p-well 36 depends on the maximum voltage of the device and may be between 0.5-10 microns.

A masked implant is then used to create the n+ layer 40. The n+ layer 40 has a depth of, for example, 0.05-1.0 microns.

Either before or after the implant which forms the shallow n+ layer 40, trenches are etched in the active areas. In one embodiment, the trenches can be, for example, 1-10 microns deep, but the minimum lateral trench widths are constrained by lithographic and etching limitations. Trenches widths less than 1 micron are preferred. The two depths of the trenches for the shallow and deep gate regions are accomplished with an additional mask to etch a portion of the deep trenches prior to etching the shallow trenches.

After the trenches are etched, gate oxide 39 (FIG. 3) is grown on the sidewalls and bottoms of the trenches to, for example, 0.05-0.15 microns thick. Conductive material, such as heavily doped polysilicon or undoped polysilicon that is subsequently doped, fills the trenches and is planarized to form the gate regions in all the cells (including gate regions 38, 72, and 56).

A contact mask opens the dielectric (e.g., oxide) layer 46 above the selected regions on the top surface to be contacted by metal electrodes. There may be multiple openings over each n+ emitter region for distributing current.

Various metal layers are then deposited to form the gate electrodes 44, the cathode electrode 42, and the anode electrode 54. The p+ substrate 52 may be thinned.

The thyristors in any of the figures may have the anode and cathode reversed by reversing the polarities of the materials.

Additional detail regarding the fabrication of the various regions and trenches may be found in the above-identified documents incorporated herein by reference.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An insulated gate turn-off thyristor formed as a die comprising:
   a first semiconductor layer of a first conductivity type;
   a first electrode in electrical contact with the first semiconductor layer;
   a second semiconductor layer of a second conductivity type over the first semiconductor layer;
   a third semiconductor layer of the first conductivity type over the second semiconductor layer;
   a matrix of cells comprising a plurality of insulated gate electrodes within trenches formed at least within the third semiconductor layer;
   a fourth semiconductor layer of the second conductivity type over the third semiconductor layer, wherein there is no semiconductor material of the first conductivity type overlying the fourth semiconductor layer, the fourth semiconductor layer being formed in first areas between at least some of the gate electrodes, wherein a vertical structure of NPN and PNP transistors is formed, and conduction between the first semiconductor layer and the fourth semiconductor layer is controlled by a voltage applied to the gate electrodes; and
   a second electrode in electrical contact with the fourth semiconductor layer,
   wherein a majority of the gate electrodes are first gate electrodes that extend only within the third semiconductor layer, and wherein a minority of the gate electrodes are second gate electrodes that extend through the third semiconductor layer and into the second semiconductor layer.

2. The thyristor of claim 1 wherein the second gate electrodes are configured to form an inversion layer, when a certain potential is applied to the second gate electrodes, to form a conductive channel between the fourth semiconductor layer and the second semiconductor layer.

3. The thyristor of claim 2 wherein the second gate electrodes increase a beta of one of the NPN and PNP transistors when the certain potential is applied to the second gate electrodes.

4. The thyristor of claim 3 wherein the second gate electrodes are configured to increase the beta of one of the NPN and PNP transistors while a potential is applied to the first gate electrodes to increase a beta of the other of the NPN and PNP transistors to initiate thyristor action.

5. The thyristor of claim 1 wherein the second gate electrodes are deeper than the first gate electrodes.

6. The thyristor of claim 1 wherein the second gate electrodes are approximately a same depth as the first gate electrodes, and the third semiconductor layer is thinner in an area of the second gate electrodes to cause the second gate electrodes to extend into the second semiconductor layer.

7. The thyristor of claim 1 wherein the first conductivity type is a p-type and the second conductivity type is an n-type.

8. The thyristor of claim 1 wherein the first conductivity type is an n-type and the second conductivity type is a p-type.

9. The thyristor of claim 1 wherein the first semiconductor layer is a substrate.

10. The thyristor of claim 1 wherein the third semiconductor layer is a well.

11. The thyristor of claim 1 where there is at least one second gate electrode in each cell.

12. The thyristor of claim 1 wherein the second gate electrodes are distributed about the matrix of cells.

13. The thyristor of claim 1 wherein the first semiconductor layer acts as an emitter for the PNP transistor, the second semiconductor layer acts as a base for the PNP transistor and a collector for the NPN transistor, the third semiconductor layer acts as a base for the NPN transistor and a collector for the PNP transistor, and the fourth semiconductor layer acts as an emitter for the NPN transistor.

14. The thyristor of claim 1 wherein the first gate electrodes and the second gate electrodes are shorted together.

15. An insulated gate turn-off thyristor formed as a die comprising:
 a first semiconductor layer of a first conductivity type;
 a second semiconductor layer of a second conductivity type over the first semiconductor layer;
 a third semiconductor layer of the first conductivity type over the second semiconductor layer;
 a matrix of cells comprising a plurality of insulated gate electrodes within trenches formed at least within the third semiconductor layer; and
 a fourth semiconductor layer of the second conductivity type over the third semiconductor layer, the fourth semiconductor layer being formed in first areas between at least some of the gate electrodes, wherein a vertical structure of NPN and PNP transistors is formed, and conduction between the first semiconductor layer and the fourth semiconductor layer is controlled by a voltage applied to the gate electrodes,
 wherein some of the gate electrodes are first gate that extend only within the third semiconductor layer, and wherein others of the gate electrodes are second gate electrodes that extend through the third semiconductor layer and into the second semiconductor layer,
 wherein the first gate electrodes and the second gate electrodes are electrically isolated from each other to enable separate control of the first gate electrodes and the second gate electrodes.

16. A method of controlling an insulated gate turn-off thyristor formed as a die, the thyristor comprising a first semiconductor layer of a first conductivity type; a first electrode in electrical contact with the first semiconductor layer; a second semiconductor layer of a second conductivity type over the first semiconductor layer; a third semiconductor layer of the first conductivity type over the second semiconductor layer; a matrix of cells comprising a plurality of insulated gate electrodes within trenches formed at least within the third semiconductor layer; and a fourth semiconductor layer of the second conductivity type over the third semiconductor layer, wherein there is no semiconductor material of the first conductivity type overlying the fourth semiconductor layer, the fourth semiconductor layer being formed in first areas between at least some of the gate electrodes, wherein a vertical structure of NPN and PNP transistors is formed, and conduction between the first semiconductor layer and the fourth semiconductor layer is controlled by a voltage applied to the gate electrodes, a second electrode in electrical contact with the fourth semiconductor layer, wherein a majority of the gate electrodes are first gate electrodes that extend only within the third semiconductor layer, and wherein a minority of the gate electrodes are second gate electrodes that extend through the third semiconductor layer and into the second semiconductor layer, the method comprising:
 applying a first voltage to the second gate electrodes to create an inversion layer in the third semiconductor layer and increase a beta of one of the NPN and PNP transistors; and
 while applying the first voltage, also applying a second voltage to the first gate electrodes to modulate a base width of the other of the NPN and PNP transistors to increase a beta of the other of the NPN and PNP transistors to initiate thyristor action, causing the thyristor to conduct current between the first semiconductor layer and the fourth semiconductor layer.

17. The method of claim 16 wherein the first gate electrodes and the second gate electrodes are shorted together, and the first voltage equals the second voltage.

18. The method of claim 16 wherein the first gate electrodes are electrically isolated from the second gate electrodes, the method further comprising:
 when turning off the thyristor, keeping the first voltage applied to the second gate electrodes for a time after the second voltage has been removed from the first gate electrodes.

19. The method of claim 16 wherein the first gate electrodes are electrically isolated from the second gate electrodes, the method further comprising:
 supplying the first voltage and the second voltage at different times to the second gate electrodes and the first gate electrodes to achieve a desired current profile of the thyristor when turning on.

20. The method of claim 16 wherein the first gate electrodes are electrically isolated from the second gate electrodes, the method further comprising:
 supplying the first voltage to the second gate electrodes that is different from the second voltage to the first gate electrodes to achieve a desired operation of the thyristor.

* * * * *